United States Patent [19]

Draper et al.

[11] Patent Number: 4,495,255

[45] Date of Patent: Jan. 22, 1985

[54] LASER SURFACE ALLOYING

[75] Inventors: Clifton W. Draper, Hopewell; John M. Poate, Summit, both of N.J.

[73] Assignee: AT&T Technologies, Inc., New York, N.Y.

[21] Appl. No.: 202,290

[22] Filed: Oct. 30, 1980

[51] Int. Cl.³ .......................... C23C 5/00; B05D 3/06; B23K 9/00; B32B 15/00

[52] U.S. Cl. ..................... 428/669; 29/879; 219/121 LM; 427/53.1; 427/88; 427/89; 427/91; 427/125; 428/672; 428/680

[58] Field of Search ............... 427/53.1, 88, 89, 91, 427/123, 125, 399; 219/121 LM, 121 LE, 121 LF; 428/669, 672, 680; 29/879

[56] References Cited

U.S. PATENT DOCUMENTS

| | | | |
|---|---|---|---|
| 3,900,593 | 8/1975 | Herczog et al. | 427/53.1 |
| 3,952,180 | 4/1976 | Gnanamuthu | 219/121 LM |
| 4,004,889 | 1/1977 | Gale et al. | 29/182.2 |
| 4,015,100 | 3/1977 | Gnanamuthu et al. | 219/121 LM |
| 4,068,022 | 1/1978 | Glick | 427/125 |
| 4,109,297 | 8/1978 | Lesh et al. | 427/125 X |
| 4,117,302 | 9/1978 | Earle et al. | 219/121 LM |
| 4,122,240 | 10/1978 | Banas et al. | 428/655 |
| 4,151,008 | 4/1979 | Kirkpatrick | 219/121 LM |
| 4,157,923 | 6/1979 | Yen et al. | 148/4 |
| 4,212,900 | 7/1980 | Serlin | 427/53.1 |
| 4,226,899 | 10/1980 | Thiel et al. | 427/250 X |
| 4,258,078 | 3/1981 | Celler et al. | 427/53.1 X |

FOREIGN PATENT DOCUMENTS 2749456 5/1979 Fed. Rep. of Germany .
1499602 2/1978 United Kingdom .

OTHER PUBLICATIONS

Material Processing with High Power Lasers, R. A. Hella, Optical Eng., vol. 17, No. 3, May-Jun. 1978, pp. 198-201.
Laser Annealing and Diffusion Definition Using Metal Layers, H. J. Hovel, IBM Tech. Bulletin, vol. 21, No. 10, 3/1979, p. 4285.
Formation of Diffusion Barrier in Thin Films Using Laser Annealing, C. A. Chang, IBM Tech. Disclosure Bulletin, vol. 22, No. 8A, 1/1980, pp. 3387.
Laser Induced Surface Alloy Formation and Diffusion of Antimony in Aluminum, A. K. Jain, et al, Nuclear Instruments and Methods, 168 (1980), pp. 275-282.
Badertscher et al. , "Ohmic Contacts on n-GaAs Produced by Laser Alloying of GE Films", (Jan. 1980).

*Primary Examiner*—Thurman K. Page
*Attorney, Agent, or Firm*—D. J. Kirk

[57] ABSTRACT

A very thin gold coating (e.g., 270 to 3,500 Angstroms) is vapor deposited on the surface of a nickel substrate. A short radiant energy pulse from a laser having a pulse length of about 130 nanoseconds is directed at the coated surface to melt portions of the gold coating and the nickel substrate therebelow. The energy pulse is removed to permit the melted material to resolidify as an alloy with a high concentration of gold at the surface thereof.

2 Claims, 6 Drawing Figures

LASER SURFACE ALLOYING

TECHNICAL FIELD

The instant invention relates to alloying of materials. In particular, very thin layers of metallic materials are surface alloyed with portions of a substrate material using pulses of radiant energy.

BACKGROUND OF THE INVENTION

In recent years, with the demand for new materials, concern over the supply of strategic elements, and the growing awareness of waste associated with corrosive and frictional forces, activity in laser alloying of materials has increased substantially.

A typical, well known technique for alloying materials together using a continuous beam of laser light is described in U.S. Pat. No. 4,177,302 to Earle et al. The Earle patent is directed to applying a relatively uniform hard surface coating to an article of dissimilar material by thermal liquification of the material and the adjacent portion of the article. A metallic powder is deposited on the annular seat of an engine value and a continuous laser beam is directed thereat to form an extremely hot zone. The value is rotated and the focused laser beam liquifies both the powder and an adjacent portion of the value at the interaction zone relatively rapidly without excessive heating of the entire engine valve to form an alloy of the materials. This alloy surface is relatively thick, 0.050 inch, very hard, forms an excellent interstitial bond and has a uniform distribution of alloyed materials therein.

Additionally, U.S. Pat. No. 4,015,100 to Gnanamuthu et al. discloses the use of a continuous laser beam to alloy a relatively thick metal powder coating ($\frac{1}{4}$" and greater) to a metallic substrate to improve the surface hardness thereof. The metal powder coating contains minor components of an alloy having a metal of the substrate as a major component thereof. The laser melting promotes mixing with a depth of melt of 2–200 mils.

U.S. Pat. No. 4,157,923 to Yen et al. is also directed to surface alloying and heat treating processes for purposes of case hardening of metal articles. An alloy layer is deposited on a base metal by plasma stream spraying of powdered alloy metal. A high energy beam is then directed at the coated surface to melt the deposited material and a portion of the base metal thereunder. Deposited alloy layers having a thickness of 6 mils have been melted along with the subjacent base metal to a depth of 25 mils to form the desired surface alloy.

The foregoing processes are accomplished by using a continuous beam of radiant energy (e.g., CW $CO_2$ laser) moved relative to the surface to be alloyed. Such processes cause deep melting resulting in a very low surface concentration of the alloyed material. Additionally, relatively long melt times are required which cause dilution of the alloying specie. Such techniques are most effective when the alloyed materials are intended to be thick and hard for purposes of wear resistance. However, it would be most desirable to adapt such techniques to alloy very thin metallic coating (e.g., less than 10,000 Å) of an electrically conductive material on metallic substrates to provide corrosion protection, reliable electrical contacts or the like. In addition, it is further desirable that the surface of the resulting alloy have a high concentration of the very thin metallic coating material.

Accordingly, there is a need for a method for alloying very thin films of metal with substrate materials without substantial mixing and dilution which will result in a high concentration of the very thin film of metal at the surface of the resulting alloy.

SUMMARY OF THE INVENTION

The instant invention is directed to a method of surface alloying. The method comprises the steps of depositing a very thin metallic coating material on a metallic substrate, said materials being alloyable. A short radiant energy pulse is directed at the coated substrate to melt portions of the coating and the substrate therebelow. The radiant energy pulse is then removed to cool and resolidify the metallic as an alloyed material.

The instant technique may be used to fabricate an electrical connector member having an electrical contact area thereon wherein the contact area is an alloy of a very thin metallic film and a portion of the connector member material. The alloyed contact has a greater concentration of the very thin metallic film material than the connector member material at the surface of the alloyed electrical contact area.

Advantageously, alloying of such very thin surfaces to form contact areas can reduce the amount of strategic and/or expensive precious surface material required.

Furthermore, by alloying the materials there is no interface therebetween resulting in a high strength bond.

DETAILED DESCRIPTION OF THE INVENTION

Figure 1:
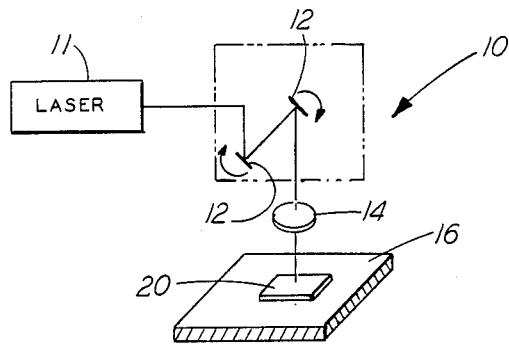
FIG. 1 is a schematic of a laser surface alloying system used to implement the instant invention.

The instant invention will be described in terms of laser surface alloying very thin layers of gold on nickel. However, such description is for purposes of exposition and not for limitation. Very thin layers of any combination of alloyable materials, such as palladium on nickel; tin on nickel; tantalum on nickel; palladium on titanium or the like may be laser surface alloyed to depths using the instant techniques. Basically, any alloying speciesubstrate combination which has solubility in the liquid phase can be surface alloyed using the instant techniques. Those combinations which are immiscible in the liquid phase (e.g., silver on nickel) cannot be effectively alloyed by the instant techniques as mixing and diffusion control the redistribution to form an alloy. Combinations with widely differing melting temperatures and vapor pressures can present problems in that a low melting point specie (Zm, Cd, As, Sb) on top of a high melting point substrate (Mo, W, Ta, Re, Os) would lead to vaporization of the film before the melting of the substrate.

The term very thin film coating as used herein refers to coatings in the Angstrom range. In particular, coatings of gold in the range of 270 Å to 3,500 Å thick have been successfully alloyed to nickel substrates using the instant techniques. However, the invention is not limited to such a range for it will become clear that by using different materials having different thermal diffusivities; varying the length of the radiant energy pulse; or the power density of the pulse, the thickness of the very thin coating to be alloyed can be increased or decreased. Additionally, the short radiant energy pulse lengths used to implement the instant invention were on the order of about 130 to 140 nanoseconds in length. However, the pulse length ($t_p$) can also vary within broader limits depending on the apparent thermal diffusivity (D), which is a weighted average of the thermal diffusivities of the very thin film material and substrate material, and the desired thermal diffusion length (X) in accordance with the following equation:

$$t_p = X^2/2D \tag{1}$$

As hereinbefore mentioned, laser surface alloying has been used to form alloys on surfaces for purposes of wear and corrosion resistance or the like. However, there has been no successful attempt to laser alloy very thin metallic film on metal substrate surfaces to obtain the benefits (e.g., low electrical resistance, corrosion resistance) of the resulting thin alloyed layer while using very small amounts of the very thin film which may be an expensive metal such as gold. When laser surface alloying for purposes of case hardening or the like, it was always desirable to form as thick an alloy as possible.

Furthermore, it is important, at times, to have a high concentration of the deposited very thin metal film material at the surface of the resulting alloy. For instance, where the deposited coating of very thin film material is gold which is to be alloyed with a nickel substrate it is most desirable to have a much higher concentration of gold than nickel at the surface of the alloy when forming an electrical contact. The prior art techniques cannot form such alloys having high surface concentrations of the very thin film coating material.

The instant invention has overcome the foregoing problems associated with the prior art laser alloying systems by directing short radiant energy pulses at a metallic substrate which is coated with a very thin metallic coating material. The short radiant energy pulse melts the very thin film coating and a portion of the substrate material therebelow. At the termination of the pulse the melted metals resolidify forming an alloyed material in the melted zone or region.

FIG. 1 shows a schematic diagram of a laser alloying system, generally referred to by the numeral 10, used successfully to alloy very thin film layers of metal to metallic substrates. The system 10 is comprised of an acousto-optically Q-switched Nd-YAG laser 11; first and second galvanometer controlled mirrors 12 and 13, respectively; a multi-element telecentric lens 14; and an article holder 16. In the operation of an exemplary embodiment, an article 20 comprised of a nickel substrate with a very thin film coating of gold thereon, is fixedly positioned on the holder 16 by means of a vacuum or clamps (not shown). The head of the laser 11 is continuously pumped to provide output pulses at a repetition rate of approximately 11 KHz. The pulse width, as defined by half power points is 130 nanoseconds and the average laser power is 2.0 watts. The laser 11 is operated in the $TEM_{oo}$ mode and the size of the focused spot, as defined by 1/e points, is 35 micrometers in diameter.

The radiant energy pulses from the laser 11 are directed towards and raster scanned by the galvanometer controlled mirrors 12 and 13 in a well known manner and through the lens 14 which provides flat focusing of the pulses over the field of the article 20. The raster scan results in laser pulses impinging on the coated substrate at spacings of 18 micrometer spot-to-spot and 10 micrometer line-to-line.

Alternatively, the laser 11 may be a lithium iodate, frequency doubled, Q-switched Nd-YAG laser. The head of the laser being continuously pumped to provide output pulses at a repetition rate of 5 KHz with a pulse width of 140 nanoseconds and an average power of 225 milliwatts and operating in the $TEM_{oo}$ mode with a focused spot size of 34 micrometers. The spacings of the raster scanned laser pulses are 10 micrometer spot-to-spot and 10 micrometers line-to-line. Both laser alloying systems are operated to open air without the use of cover gases, however, such cover gases may be used where it is necessary to prevent oxidation.

The article 20 processed by the laser alloying system 10 in the exemplary embodiment was cold rolled polycrystalline nickel 200 substrate having a thickness of 0.64 mm. The substrates were 20×20 mm squares and cleaned ultrasonically in detergent, purified water, and finally spectroscopic grade methanol. The very thin gold films are vacuum deposited onto room temperature substrates at pressures of $10^{-7}$ torr. The gold film thicknesses were determined by Rutherford Backscattering (RBS). The preirradiation sample structures, incident power densities, and pulse times for the two exemplary laser systems are given in Table I.

TABLE I

| | Processing Parameters for Alloying Au on Ni | | |
|---|---|---|---|
| Column | 1 | 2 | 3 |
| Laser | Nd-YAG | Nd-YAG | FD Nd-YAG |
| Wavelength | 1.06 μm | 1.06 μm | 0.53 μm |
| Article | Ni + 3,400Å Au | Ni + 2,000Å Au + Pd | Ni + 1,500Å Au |
| Incident Power Density (MW/cm$^2$) | 147 | 102 | 35 |
| Pulse Time (Nanoseconds) | 130 | 130 | 140 |

Figure 2:
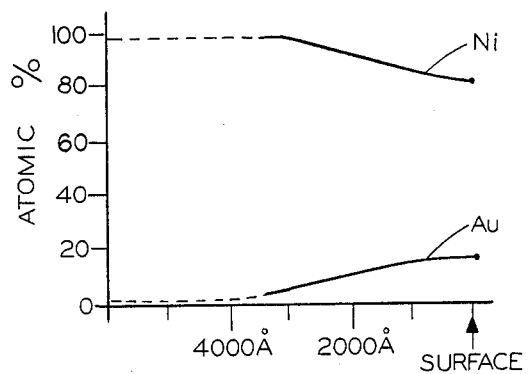
FIGS. 2, 3 and 4 are graphs depicting the concentrations of materials alloyed using various laser parameters.
Figure 3:
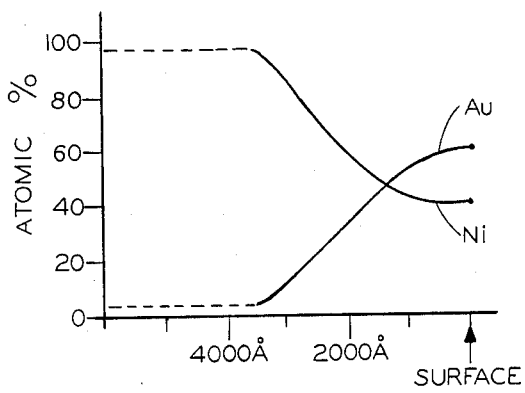
Figure 4:
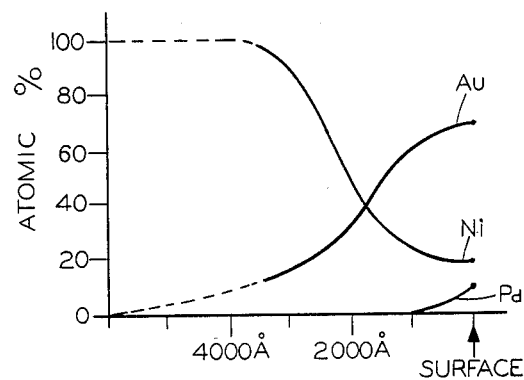

The laser alloyed articles 20 all have concentrated near surface alloys, with the gold concentration in the alloy falling off sharply at depths less than 5,000 Å as can be seen in FIGS. 2 to 4 which represents the parameters set forth in columns 1 to 3, respectively, of Table I.

There was significant loss of gold in the Ni+3400 Å gold sample when irradiated with the Q-switched YAG at 1.06 μm. Most of the gold (e.g., greater than 50%) appears to be lost in this case. Film loss is so extensive that the gold can literally be transferred and collected on transparent glass slides positioned above the sample during irradiation. There is no indication of significant film loss in the other samples in Table I.

The combination of short pulse times and high incident power density at 1.06 m (see Table I) needed to overcome the high reflectance of gold leads to film evaporation and/or explosive removal. Both mechanisms have been observed in very thin film machining with Q-switched lasers. In contrast, a 270 Å gold film coating on nickel has been laser surface alloyed with Q-switched 1.06 μm radiation without any gold loss.

The explanation for this anomaly appears to lie in the fact that the reflectance of very thin gold film coatings are substantially lower than thicker gold film coatings. A substantially lower (25%) incident power density was required for coupling to the article 20 having the 270 Å gold film coating.

The use of a radiant energy absorbing cap 41 (see FIG. 5) or so called sandwich structure can circumvent the aforementioned shortcomings caused by the reflectance of the gold film. This is seen in (i) the lower incident power density required for coupling (see column 2, Table I), (ii) the higher alloying concentrations attained (FIG. 4), and (iii) by the fact that there is no evidence of film loss via vaporization or explosive removal. The reflectance cap 41 having a thickness of about 300 Å was deposited on a nickel substrate having a 3,500 Å gold coating thereon. Palladium was used for the cap 41 in that it has an excellent match with nickel in both reflectance and thermal diffusivity. Although palladium was used for the cap 41, other materials such as Ni, Sn, Co or the like may be used. FIG. 4 depicts the surface and near surface concentrations of the resulting alloyed material using the palladium cap 41.

Significantly lower incident power densities are required (see column 3, Table I) for laser surface alloying processing with the frequency doubled Q-switched YAG laser used in the system 10 shown in FIG. 1. All of the very thin gold film layer is retained and high near surface alloy concentrations of gold are obtained as seen in FIG. 3.

Figure 5:
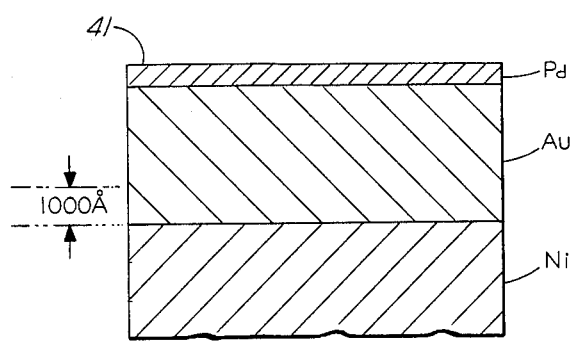
FIG. 5 depicts a Palladium-Gold-Nickel combination prior to laser alloying.

Both the sandwich structures of FIG. 5 laser alloyed at 1.06 μm and gold film alone on nickel laser alloyed at 0.53 μm have been laser surface alloyed over a range of film thicknesses from 270–3,500 Å, in order to span a wide range of gold surface alloy concentrations (1–90 AT%gold).

The foregoing examples are directed to forming surface alloys (e.g., approximately 5,000 Å in depth) on planar substrates with very thin metallic films deposited thereon. Such surface alloys can be particularly advantageous where expensive, precious metal surfaces are required but not necessary to form the bulk of the materials.

A particular embodiment (see FIG. 6) makes use of the instant laser surface alloying technique wherein a small spot of gold 60 is required to be placed on a contact area of a nickel electrical connector tine 61. Heretofore, formation of such small spots of gold were deposited by selective plating techniques. However, such wet chemical electrodeposition processes are cumbersome, time consuming and expensive.

Figure 6:
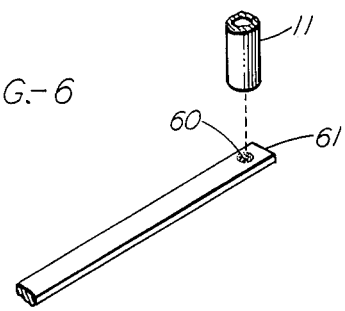
FIG. 6 is an isometric view of a connector tine with a selectively alloyed gold portion thereon.

Initially, a very thin spot of gold is selectively vapor plated at the desired location as shown in FIG. 6. The spot of gold 60 is then irradiated by a laser beam using the laser scanning system 10 shown in FIG. 1 to alloy the gold to the nickel using pulse time, gold thicknesses and incident power densities as set forth in either of the two right-hand columns of Table I. Such an alloyed contact results in a higher strength contact with low electrical resistivity with a minimum amount of gold. Advantageously, the resultant alloy which forms the contact area 60 may have a higher concentration of gold than nickel at the surface of the alloy. Alternatively, one can also vapor deposit the entire surface of the connector tine 61, selectively alloy the contact area 60 and then recover the unalloyed gold easily since adhesion will be poor where not alloyed.

Further, the use of the radiant energy absorbing cap 41 as shown in FIG. 5 provides an effective contact alloy which can be used to selectively form contact areas 60 on connectors 61. Additionally, the connector tine 61 is not limited to nickel, for other well known connector materials such as copper, copper alloys or the like may be used.

It is to be understood that the embodiments described herein are merely illustrative of the principles of the invention. Various modifications may be made thereto by persons skilled in the art which embody the principles of the invention and fall within the spirit and scope thereof.

We claim:

1. A method of surface alloying, comprising the steps of:
   depositing a 270 A. to 3500 A. thick coating of gold on a nickel substrate;
   depositing a very thin layer of palladium having a thickness of about 300 A. on the gold coated substrate; and
   raster scanning a plurality of laser pulses of such a length and power density at the coated substrate so as to melt portions of the gold, palladium and the nickel to form an alloy on the surface thereof to a depth of approximately 5,000 A., the alloy having a higher concentration of the gold coating material than the nickel material at the surface of the alloy.

2. An electrical connector having an electrical contact area which is a surface alloy formed by the method of claim 1.

* * * * *

UNITED STATES PATENT AND TRADEMARK OFFICE
CERTIFICATE OF CORRECTION

PATENT NO. : 4,495,255

DATED : January 22, 1985

INVENTOR(S) : C.W. Draper and J. M. Poate

It is certified that error appears in the above-identified patent and that said Letters Patent is hereby corrected as shown below:

Column 1, line 24, "value" should read --valve--; line 26, "value" should read --valve--; line 28, "value" should read--valve--.

Column 4, line 18, "to open" should read--in open--.

Signed and Sealed this

Sixth Day of August 1985

[SEAL]

*Attest:*

DONALD J. QUIGG

*Attesting Officer*     *Acting Commissioner of Patents and Trademarks*

UNITED STATES PATENT AND TRADEMARK OFFICE
CERTIFICATE OF CORRECTION

PATENT NO. : 4,495,255
DATED : January 22, 1985
INVENTOR(S) : C.W. Draper et al

It is certified that error appears in the above-identified patent and that said Letters Patent is hereby corrected as shown below:

On the title page assignee should read

-- (73) Assignees: AT&T Technologies, Inc., New York, N. Y. and Bell Telephone Laboratories, Inc., Murray Hill, N.J. --.

Signed and Sealed this

Third Day of December 1985

[SEAL]

Attest:

Attesting Officer

DONALD J. QUIGG

Commissioner of Patents and Trademarks